United States Patent [19]
Tanaka et al.

[11] Patent Number: 6,127,904
[45] Date of Patent: *Oct. 3, 2000

[54] SURFACE ACOUSTIC WAVE FILTER HAVING UNIDIRECTIONAL AND BIDIRECTIONAL TRANSDUCERS

[75] Inventors: Mitsuhiro Tanaka, Chita-Gun; Susumu Nomoto, Nagoya; Masahiko Sugiyama, Nagoya; Kenji Suzuki, Nagoya, all of Japan

[73] Assignee: NGK Insulators, Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 09/201,872

[22] Filed: Nov. 30, 1998

Related U.S. Application Data

[62] Division of application No. 08/842,268, Apr. 24, 1997, Pat. No. 5,909,157, which is a division of application No. 08/558,607, Oct. 31, 1995, Pat. No. 5,663,695.

[30] Foreign Application Priority Data

Oct. 31, 1994 [JP] Japan ................... 6-267220

[51] Int. Cl.[7] .................................... H03H 9/64
[52] U.S. Cl. .................. 333/193; 333/196; 310/313 B; 310/313 C
[58] Field of Search ................... 333/193–196; 310/313 R, 313 B, 313 C, 313 D

[56] References Cited

U.S. PATENT DOCUMENTS

| | | | |
|---|---|---|---|
| 4,468,642 | 8/1984 | Hikita | 333/196 |
| 4,513,261 | 4/1985 | Yen et al. | 333/196 |
| 4,642,506 | 2/1987 | Lewis | 310/313 B X |
| 4,727,275 | 2/1988 | Milsom | 333/195 X |
| 5,010,269 | 4/1991 | Hikita et al. | 310/313 B |
| 5,294,859 | 3/1994 | Yamanouchi et al. | 310/313 B |
| 5,306,978 | 4/1994 | Yamanouchi et al. | 310/313 C |
| 5,313,177 | 5/1994 | Hickernell et al. | 333/193 |
| 5,365,207 | 11/1994 | Borras et al. | 333/196 |
| 5,438,306 | 8/1995 | Yamanouchi et al. | 333/195 |
| 5,831,492 | 11/1998 | Solie | 333/196 X |

FOREIGN PATENT DOCUMENTS

| | | | |
|---|---|---|---|
| 0 564 881 A1 | 10/1993 | European Pat. Off. | 333/193 |
| 59-131213 | 7/1984 | Japan . | |
| 63-283309 | 11/1988 | Japan . | |
| 2-244811 | 9/1990 | Japan | 333/193 |
| 3-20929 | 3/1991 | Japan . | |
| 3-204212 | 9/1991 | Japan | 333/193 |
| 4-275710 | 10/1992 | Japan | 333/193 |
| 5-55868 | 3/1993 | Japan . | |
| 5-67936 | 3/1993 | Japan | 333/193 |
| 5-267990 | 10/1993 | Japan . | |

OTHER PUBLICATIONS

"Technical Handbook for Elastic Wave Devices", pp. 208–209, Nov. 1991, OHM Publishers, Tokyo, Japan.

*Primary Examiner*—Robert Pascal
*Assistant Examiner*—Barbara Summons
*Attorney, Agent, or Firm*—Parkhurst & Wendel, L.L.P.

[57] ABSTRACT

A surface acoustic wave filter device suitable for CDMA communication system includes a piezoelectric substrate, and a unidirectional input side transducer and a bidirectional output side transducer are formed on the substrate. The filter device has satisfactory filtering characteristics in terms of insertion loss, frequency characteristic, T.T.E. attenuation level, group delay time, etc.

3 Claims, 14 Drawing Sheets

FIG_10

FIG_12

SURFACE ACOUSTIC WAVE FILTER HAVING UNIDIRECTIONAL AND BIDIRECTIONAL TRANSDUCERS

This is a Division of application Ser. No. 08/842,268 filed Apr. 24, 1997, U.S. Pat. No. 5,909,157, which in turn is a division of application Ser. No. 08/558,607 filed Oct. 31, 1995, U.S. Pat. No. 5,663,695.

BACKGROUND OF THE INVENTION

1. Field of the invention

The present invention relates to a surface acoustic wave (SAW) filter device, in particular a surface acoustic wave filter device which is suitable for a CDMA (Code Division Multiple Access) communication system, and also to a transducer which can be suitably used for such a surface acoustic wave filter device.

2. Description of the Related Art

With a recent progressive development in digital communication technology, there have been proposed various communication systems. For example, PDMA (Frequency Division Multiple Access) system and TDMA (Time Division Multiple Access) system are used for communication purposes, wherein frequency band or time band is divided and assigned to each station. On the other hand, the CDMA system makes use of superimposed signals in terms of frequency and time, and is recognized to be highly useful in view of the possibility of preserving a large number of channels. Thus, there is a strong demand for a further development in the CDMA system. In this connection, various requirements in terms of filtering characteristics are imposed on surface acoustic wave filter devices for the CDMA communication system, which may be summarized as follows.

(a) That the filter device has an insertion loss which is not greater than 10 dB.

(b) That the filter device has a frequency characteristic which is free from distortion over a wide range.

(c) That the filter device satisfies a T.T.E. (Triple Transient Echo) attenuation level which is not less than 30 dB.

As a surface acoustic wave filter device satisfying these requirements, one may think of using a transversal-type surface acoustic wave filter device which includes a piezoelectric substrate, as well as a bidirectional input side transducer and a bidirectional output side transducer, both formed on the substrate. That is to say, because a bidirectional transducer has a frequency characteristic which is substantially free from distortion, it would be possible to realize a wide range filter device having a frequency characteristic which is substantially free from distortion over a wide range, by combining two bidirectional transducers as the input side and output side transducers.

The surface acoustic wave filter device in which two bidirectional transducers are used as the input side and output side transducers proved to be advantageous in terms of its frequency characteristic which is substantially free from distortion over a wide range. On the other hand, however, when the surface acoustic wave filter device is constituted as a transversal-type filter device, it suffers from a significant insertion loss because surface acoustic waves excited by the input side transducer propagate in both directions. Furthermore, it is difficult to use bidirectional transducers as a filter device for CDMA communication systems because of an excessively high T.T.E. attenuation level due to a symmetrical electrode arrangement. In this instance, it would be possible to attenuate the T.T.E. level by 30 dB or more, by an impedance mismatching of the filter device. However, such an impedance mismatching would result in further increase in the insertion loss. In other words, it has been believed that a T.T.E. attenuation level of 30 dB or more cannot be achieved without impedance mismatching of the transducers and resultant increase in the insertion loss. For these grounds, there has been no surface acoustic wave filter device which can be practically used for a CDMA communication system.

DISCLOSURE OF THE INVENTION

It is therefore a primary object of the present invention to provide a surface acoustic wave filter device having a satisfactory filtering characteristics in terms of insertion loss, frequency characteristic and T.T.E. attenuation level, etc.

It in another object of the present invention to provide a transducer which can be suitably used for such a surface acoustic wave filter device.

According to one aspect of the present invention, there is provided a surface acoustic wave filter device comprising:

A) a piezoelectric substrates

B) an input side transducer formed on said substrate, for exciting a surface acoustic wave; and C) an output side transducer formed on said substrate, for receiving and converting the surface acoustic wave excited by said input side transducer;

D) one of said transducers comprising a unidirectional transducer and the other of said transducers comprising a bidirectional transducer.

With the above-mentioned arrangement according to the present invention, the surface acoustic wave filter device satisfies the desired filtering characteristic by virtue of a unique combination of transducers having different conversion characteristics. More particularly, when transducers having different conversion characteristics are used as input side and output side transducers of a transversal-type surface acoustic wave filter device, the filter device as a whole exhibits a characteristic which corresponds to the composite characteristics of the two transducers. Thus, it is possible to readily realize a surface acoustic wave filter device having filtering characteristic, by appropriately combining suitable transducers in consideration of their proper characteristics, such as insertion loss, frequency characteristic, T.T.E. attenuation level, simplicity in weighting of the electrode structure, etc.

Bidirectional transducers are known in the art as a transducer which provides a frequency characteristic that is substantially free from distortion over a wide range. Such a distortion-free frequency characteristic can be obtained due to a symmetrical electrode arrangement of the bidirectional transducer. Notwithstanding such an advantageous aspect, it is a general recognition in the art that bidirectional transducers are not very suitable for a filter device for communication purposes, in view of a relatively high insertion loss due to propagation of excited surface acoustic waves in both directions.

On the other hand, unidirectional transducers are known in the art as a transducer having a low insertion loss and a high T.T.E. attenuation level. The unidirectional transducer has asymmetrical electrode structure whereby a majority of energy of the excited surface acoustic wave propagates in one direction only, so that it is possible readily to minimize the insertion loss and achieve a significantly high T.T.E. attenuation level. On the other hand, the asymmetrical electrode structure of unidirectional transducers tends to cause an excessive waveform distortion in the frequency characteristic. Thus, it is also a general recognition in the art that unidirectional transducers are not very suitable for a filter device on which strict requirements are imposed on the frequency characteristic.

The present invention in based on a novel conception that it is possible to realize an improved surface acoustic wave filter device having a satisfactory filtering characteristics in terms of insertion loss, frequency characteristic and T.T.E. attenuation level, etc., by means of a unique combination of a bidirectional transducer and a unidirectional transducer in a transversal-type filter device, so as to fully make use of a satisfactory frequency characteristic of the bidirectional transducer and of a low insertion loss and a high T.T.E. attenuation level of the unidirectional transducer.

In order to achieve a desired frequency characteristic of the surface acoustic wave filter device, it is a conventional practice to apply weighting of the electrodes of the transducers. When weighting is to be applied to the electrodes of the unidirectional transducer, a complicated process would be involved because the unidirectional propagation characteristic of the transducer is enhanced by phase inversion of the surface acoustic wave at the edges of the electrodes. Thus, in a preferred embodiment of the present invention, the unidirectional transducer is of a normal (i.e., unweighted) electrode structure and only the bidirectional transducer is of a weighted electrode structure. Such a unique combination of the two types of transducers makes it possible readily to achieve a desired frequency characteristic of the surface acoustic wave filter device, by applying weighting of the transducer electrodes in a simplified manner.

According to a particularly advantageous embodiment of the surface acoustic wave filter device of the present invention, the unidirectional transducer comprises (i) a positive electrode comprising a plurality of electrode fingers which are periodically arranged at a pitch $\lambda$ that is a propagation wavelength of a fundamental surface acoustic wave, (ii) a negative electrode comprising a plurality of electrode fingers which are periodically arranged at said pitch $\lambda$ and each situated with respect to an adjacent pair of said electrode fingers of the positive electrode at a center distance $\lambda/2$, and (iii) a floating electrode comprising a plurality of electrode fingers each situated between an adjacent electrode finger of said positive electrode and an adjacent electrode finger of said negative electrode, and offset from an intermediate position between said adjacent electrode fingers of said positive and negative electrodes, in a direction opposite to a propagation direction of said surface acoustic wave in the case of the input side transducer, and in the propagation direction of said surface acoustic wave in the case of the output side transducer, (iv) each of said electrode fingers of the positive and negative electrodes and of said floating electrode of the unidirectional transducer having a width $\lambda/12$ as measured in said propagation direction of said surface acoustic wave, and (v) each electrode finger of said floating electrode of the unidirectional transducer being offset from said intermediate position by a distance $\lambda/12$.

Furthermore, the bidirectional transducer comprises (vi) a positive electrode comprising a plurality of sets of two electrode fingers which are spaced from each other at a center distance $\lambda/4$, each electrode finger of said sets of the positive electrode having a width $\lambda/8$ as measured in said propagation direction of said surface acoustic wave, and said sets of electrode fingers of the positive electrode being periodically arranged at a pitch $\lambda$, and (vii) a negative electrode comprising a plurality of sets of two electrode fingers which are spaced from each other at a center distance $\lambda/4$, each electrode finger of said sets of the negative electrode having a width $\lambda/8$ as measured in said propagation direction of said surface acoustic wave, and each set of electrode fingers of the negative electrode being arranged between adjacent sets of electrode fingers of the positive electrode.

By using the above-mentioned unidirectional transducer, it is possible to arrange each floating electrode finger at a location which is significantly offset from the intermediate position between adjacent electrode fingers of the positive and negative electrodes, in a direction which is opposite to the propagation direction of the surface acoustic wave. Such a unique offset arrangement of the floating electrode finger serves to enhance the unidirectional propagation characteristic of the transducer and thereby reduce the insertion loss of the filter device.

In this connection, each electrode finger of the positive and negative electrodes and of the floating electrode has a width $\lambda/12$ measured in the propagation direction of the surface acoustic wave, and the offset amount of the floating electrode is $\lambda/12$. Thorough investigations carried out by the inventors revealed that, in many cases, a satisfactory unidirectional propagation characteristic of the transducer due to the asymmetrical structure of the transducer cannot be readily achieved when the offset amount is relatively small, e.g., $\lambda/8$. The electrode finger width of $\lambda/12$ in combination with the offset amount of $\lambda/12$ makes it possible to regularly and orderly arrange the electrode fingers of the positive and negative electrodes and of the floating electrodes at a basic pitch of $\lambda/12$.

Furthermore, for effectively realizing a satisfactory frequency characteristic with a minimized distortion, each electrode finger of the bidirectional transducer is of a so-called split structure and has a width $\lambda/8$. Such an electrode arrangement of the bidirectional transducer serves effectively to cancel surface acoustic waves reflected at the edges of the electrodes. Thus, it is possible to reduce the reflected waves which are different in phase, and thereby lower the ripples and improve the insertion loss characteristic of the filter device.

According to another preferred embodiment of the present invention, the piezoelectric substrate comprises a quartz substrate and the floating electrode comprises a shortcircuit-type electrode.

As known in the art, quartz exhibits only a small change in frequency relative to temperature variation. Thus, when the piezoelectric substrate is comprised of quartz, it in possible to maintain variation of frequency pass band range of the filter device due to temperature change within an allowable range. However, because quartz has a small electro-mechanical coupling coefficient, a surface acoustic wave filter device comprising a quartz substrate on which are formed known transducers as they are cannot be practically used due to a significant insertion loss of the device.

As a result of thorough investigations carried out by the inventors with reference to the insertion loss of a quartz substrate, it has been revealed that the sign of the reflection coefficient of the floating electrode is highly influential over the insertion loss. Thus, in the case of a quartz substrate, a shortcircuit-type floating electrode has a reflection coefficient which is higher than that of an open-type floating electrode, and it is therefore preferable to form the floating electrode as a shortcircuit-type floating electrode. In this instance, it is possible to minimize the insertion lose of the filter device even when use is made of a quartz substrate having a small electro-mechanical coupling coefficient, thereby realizing a wide band surface acoustic wave filter device having an improved temperature characteristic and a minimized insertion loss.

According to another preferred embodiment of the present invention, the unidirectional transducer comprises at least one electrode comprising a plurality of sets of first and second electrodes, said sets of electrode fingers being periodically arranged at a pitch $\lambda$ which is the propagation wavelength of said surface acoustic wave, said first electrode finger having a width $\lambda/8$, said second electrode finger having a width $3\lambda/8$, and said first and second electrode fingers being spaced a distance $3\lambda/8$.

The above-mentioned combination of the electrode finger having a width $\lambda/8$ with the electrode finger having a width $3\lambda/8$, the surface acoustic waves incident on the unidirectional transducer are reflected due to mismatching of acoustic impedance at the edges of the respective electrode fingers. However, the surface acoustic wave reflected at the edges of an electrode finger toward the direction opposite to the propagation direction of surface acoustic wave has a phase difference of $\lambda/2$ relative to the surface acoustic wave excited at the edge of the adjacent electrode finger and propagating in the normal propagation direction, so that undesirable reflected waves are substantially completely cancelled without the sacrifice of the insertion loss.

According to still another embodiment of the present invention, the unidirectional transducer comprises:

A) a first electrode which comprises a plurality of sets of first and second electrode fingers, which sets are periodically arranged at a predetermined pitch, said first and second electrode fingers of each set having a width $\lambda/4$ as measured in the propagation direction of the surface acoustic wave, where $\lambda$ is the propagation wavelength of said surface acoustic waver and spaced from the other by a center distance $\lambda$;

B) a second electrode comprising a plurality of electrode fingers each arranged between the first and second electrode fingers of each set of said first electrode, and having a width $\lambda/4$; and C) at least one floating electrode arranged between adjacent first and second electrode fingers of said first electrode and having a width $\lambda/4$.

In this instance, surface acoustic waves propagating in a direction opposite to the normal propagation direction are reflected by the floating electrode arranged between adjacent electrode fingers of. the first and second electrodes, so that it is possible to realize a surface acoustic wave filter device having a further reduced insertion loss.

According to still another embodiment of the present invention, the unidirectional transducer comprises:

A) a first electrode comprising a plurality of sets of electrode fingers arranged at a predetermined pitch, each of said sets of the first electrode comprising first, second, third and fourth electrode fingers each having a width $\lambda/8$ as measured in the propagation direction of the surface acoustic wave, where $\lambda$ is the propagation wavelength of said surface acoustic wave, said first and second electrode fingers of each set being spaced from each other by a center distance $\lambda/4$, said second and third electrode fingers of each set being spaced from each other by a center distance $3\lambda/4$, and said third and fourth electrode fingers of each set being spaced from each other by a center distance $\lambda/4$;

B) a second electrode comprising a plurality of sets of electrode fingers arranged at a predetermined pitch, each of said sets of the second electrode comprising fifth and sixth electrode fingers each having a width $\lambda/8$ as measured in the propagation direction of the surface acoustic wave, said fifth and sixth electrode fingers of each set being spaced from each other by a center distance $\lambda/4$ and arranged between the first and second electrode fingers of an adjacent set of the first electrodes and C) at least one floating electrode having a width $\lambda/4$ as measured in the propagation direction of the surface acoustic wave and arranged between neighbouring sets of electrode fingers of the first electrode.

In this instance, surface acoustic waves propagating in a direction opposite to the normal propagation direction are reflected by the floating electrodes arranged between adjacent sets of electrode fingers of the first electrode, so that it is possible to realize a surface acoustic wave filter device having a further reduced insertion loss.

The present invention also provides a transducer which is suitable for a surface acoustic wave filter device. The transducer according to the present invention comprises an interdigital-type transducer including a piezoelectric substrate, a positive electrode having a plurality of electrode fingers, and a negative electrode having a plurality of electrode fingers each arranged between adjacent electrode fingers of the positive electrode, said positive and negative electrodes being formed on the substrate, wherein the transducer is comprised of a unidirectional transducer portion and a bidirectional transducer portion.

When weighting is applied to the transducer by changing the overlapping length of adjacent electrode fingers in the propagation direction of the surface acoustic wave, the influence of refraction of the surface acoustic wave becomes more significant and the insertion loss of the device deteriorates as the overlapping length decreases. By forming part of the transducer as a unidirectional transducer portion, in the transducer according to the present invention, it is possible to improve the insertion loss while maintaining the overall characteristics of the transducer.

According to still another embodiment of the present invention, the transducer is of a weighted electrode type and includes electrode fingers having a maximum overlapping length with reference to adjacent electrode finger, and that portion of said substrate in which said electrode fingers having a maximum overlapping length are arranged is formed as a unidirectional transducer portion. Such an arrangement of the transducer also serves to improve the insertion loss while maintaining the overall characteristics of the transducer.

According to still another embodiment of the present invention, the surface acoustic wave filter device comprises a piezoelectric substrate, an input side transducer having a bidirectional electrode structure, and a pair of output side transducers on both sides of the input side transducer and each having a unidirectional electrode structure. In this instance, surface acoustic waves excited by the bidirectional input side transducer are propagated in both directions and received by the unidirectional output side transducers, so as to further reduce the insertion loss.

DETAILED DESCRIPTION OF THE PREFERRED EMBODIMENTS

The present invention will be further explained below with reference to some preferred embodiments shown in the accompanying drawings.

Figure 1:
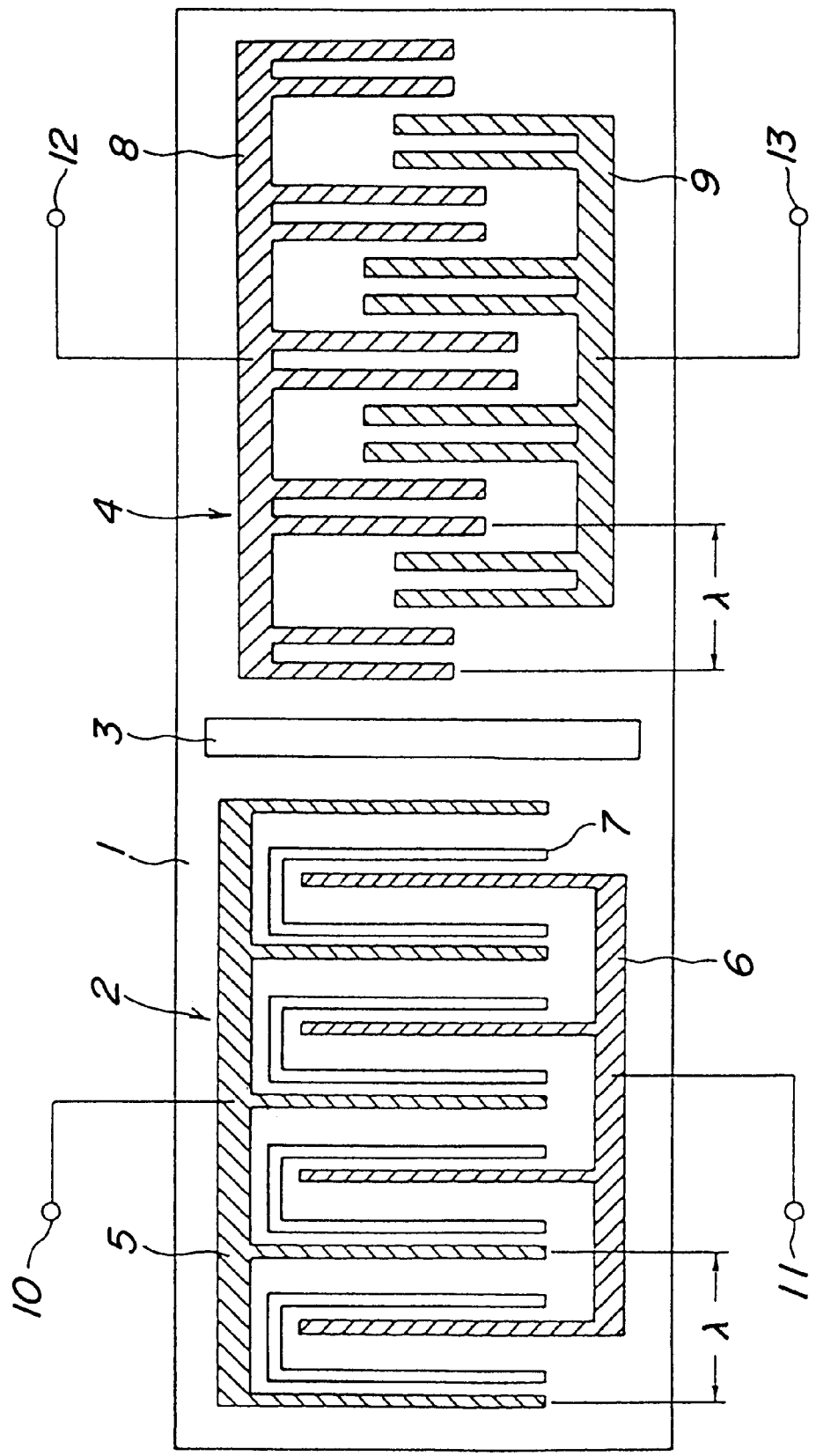
FIG. 1 is a schematic plan view showing a surface acoustic wave filter device according to a first embodiment of the present invention.

FIG. 1 is a schematic plan view of the surface acoustic wave filter device according to a first embodiment of the present invention. The surface acoustic wave filter device of this embodiment includes a generally rectangular piezoelectric substrate 1 which is comprised of quartz. As known in the art, when used as a substrate of surface acoustic wave filter devices, quartz exhibits a small variation in the pass band width relative to temperature variation and thus serves to minimize the fluctuation of the frequency characteristic due to temperature variation. The substrate 1 has a surface provided thereon with an input side transducer 2, a shield electrode 3 and an output side transducer 4 which are arranged in the stated sequence along a propagation axis of the surface acoustic wave excited by the input side transducer 2 and received by the output side transducer 4.

The input side transducer 2 is a unidirectional transducer which is comprised of a positive electrode 5, a negative electrode 6 and a plurality of floating electrodes 7, each having a plurality of electrode fingers. Each electrode finger of the positive and negative electrodes 5, 6 and the floating electrodes 7 has a width as measured in the propagation direction of the surface acoustic wave, which is $1.1 \times \lambda/12$, where $\lambda$ is the wavelength of the fundamental surface acoustic wave. Adjacent electrode fingers of the positive electrode 5 are spaced from each other and periodically arranged at a pitch $\lambda$. Similarly, adjacent electrode fingers of the negative electrode 6 are spaced from each other and periodically arranged at a pitch $\lambda$. Each electrode finger of the negative electrode 6 is arranged between adjacent electrode fingers of the positive electrode 5 in an interdigital manner. The center distance between each electrode finger of the positive electrode S and an adjacent electrode finger of the negative electrode 6 is $\lambda/2$. Each electrode finger of the floating electrodes 7 is arranged at a location which is offset by an amount of $\lambda/12$, from the intermediate position between adjacent electrode fingers of the positive and negative electrodes 5 and 6, toward the upstream side of the propagation direction of the surface acoustic wave, thereby to enhance the unidirectional characteristic of the transducer due to an asymmetrical structure. As for the input side transducer 2, the number of pairs of positive and negative electrode fingers may be determined as appropriate, depending upon the desired filtering characteristic. For example, there may be provided forty pairs of the electrode fingers.

In the embodiment shown in FIG. 1, each electrode finger of the floating electrodes 7 is substantially offset from the intermediate position between adjacent electrode fingers of the positive and negative electrodes 5 and 6 to provide an enhanced unidirectional characteristic of the transducer due to asymmetrical electrode finger arrangement, which serves effectively to lower the insertion loss of the filter device. A unidirectional transducer with such asymmetrical electrode finger arrangement is known, per se, in which the electrode finger width is set to be $\lambda/8$. In this instance, however, it is often difficult effectively to realize a satisfactory unidirectional characteristic of the transducer, because each electrode finger of the floating electrodes could not be sufficiently offset from the intermediate position between adjacent electrode fingers of the positive and negative electrodes. Therefore, according to the present invention, each electrode finger of the floating electrodes 7 has a width $\lambda/12$ and is offset by an amount of $\lambda/12$ from the intermediate position between adjacent electrode fingers of the positive and negative electrodes 5 and 6, toward the upstream side of the propagation direction of the surface acoustic wave. This means that the present invention makes it possible to regularly arrange the electrode fingers of the positive and negative electrodes and of the floating electrodes, at a basic pitch of $\lambda/12$. Moreover, the electrode finger arrangement according to the present invention serves to minimize the ripple, and this is due to the fact that occurrence of irregular phase shifting as a result of reflection of surface acoustic waves at the edges of the electrode fingers does not take place.

The output side transducer 4 includes a positive electrode 8 and a negative electrode 9 each having a split electrode structure in which a plurality of sets of two electrode fingers are periodically arranged at a pitch $\lambda$, and the two electrode fingers of each set are spaced from the other at a center distance of $\lambda/4$. In order to provide an improved conversion efficiency of the surface acoustic wave, each electrode finger of the positive electrode 8 and the negative electrode 9 has a width which is $\lambda/8$. As for the output side transducer 4, the number of sets of positive and negative electrode fingers may be determined as appropriate, depending upon the desired characteristic. For example, there may be provided 300 sets of electrode fingers of the positive electrode 8 and the negative electrode 9.

The output side transducer 4 has an interdigital-type electrode finger arrangement wherein the positive and negative electrode fingers which are overlapped with each other as seen in the propagation direction of the surface acoustic wave. Moreover, the electrode finger arrangement of the output side transducer 4 is weighted in accordance with the so-called apodizing method, wherein the overlapping length of the positive and negative electrode fingers as measured in a direction perpendicular to the propagation direction of the surface acoustic wave varies in the propagation direction of the surface acoustic wave.

The operation of the surface acoustic wave filter device according to the embodiment of FIG. 1 will be explained below.

When an input electric signal to be filtered is applied to input terminals 10, 11 connected respectively to the positive electrode 5 and the negative electrode 6 of the input side transducer 2, surface acoustic waves are excited by the input side transducer 2 and propagate substantially in one direction only, toward the output side transducer 4, via the shield electrode 3. The surface acoustic waves are converted by the output side transducer 4 into an electric signal which is then supplied to output terminals 12, 13 of the filter device which are connected respectively to the positive electrode 8 and the negative electrode 9 of the output side transducer 4. The output signal supplied to the output terminals 12, 13 has a frequency characteristic which corresponds to the frequency characteristic of the input-side transducer 2 as multiplied by that of the output side transducer 4. Thus, by means of an optimum combination of the input side and output side transducers in a transversal-type filter device, it is possible to realize a surface acoustic wave filter device which fully makes use of a satisfactory frequency characteristic of of the output side transducer 4 in combination with advantageous characteristics of the input side transducer in terms of insertion lose and T.T.E. (Triple Transient Echo) level. Therefore, according to the embodiment of FIG. 1, it is possible to realize a surface acoustic wave filter device which is capable of satisfying all the requirements for the frequency characteristic, insertion loss and T.T.E. level.

Similar advantageous functions can also be achieved when the input side transducer is comprised of a bidirectional transducer and combined with an output side transducer which, in turn, is comprised of a unidirectional transducer. Also, while the electrode 8 and the electrode 9 have been used as a positive electrode and a negative electrodes respectively, the relationship may be reversed so that the electrode 8 and the electrode 9 are used as a negative electrode and a positive electrode, respectively.

Figure 2:
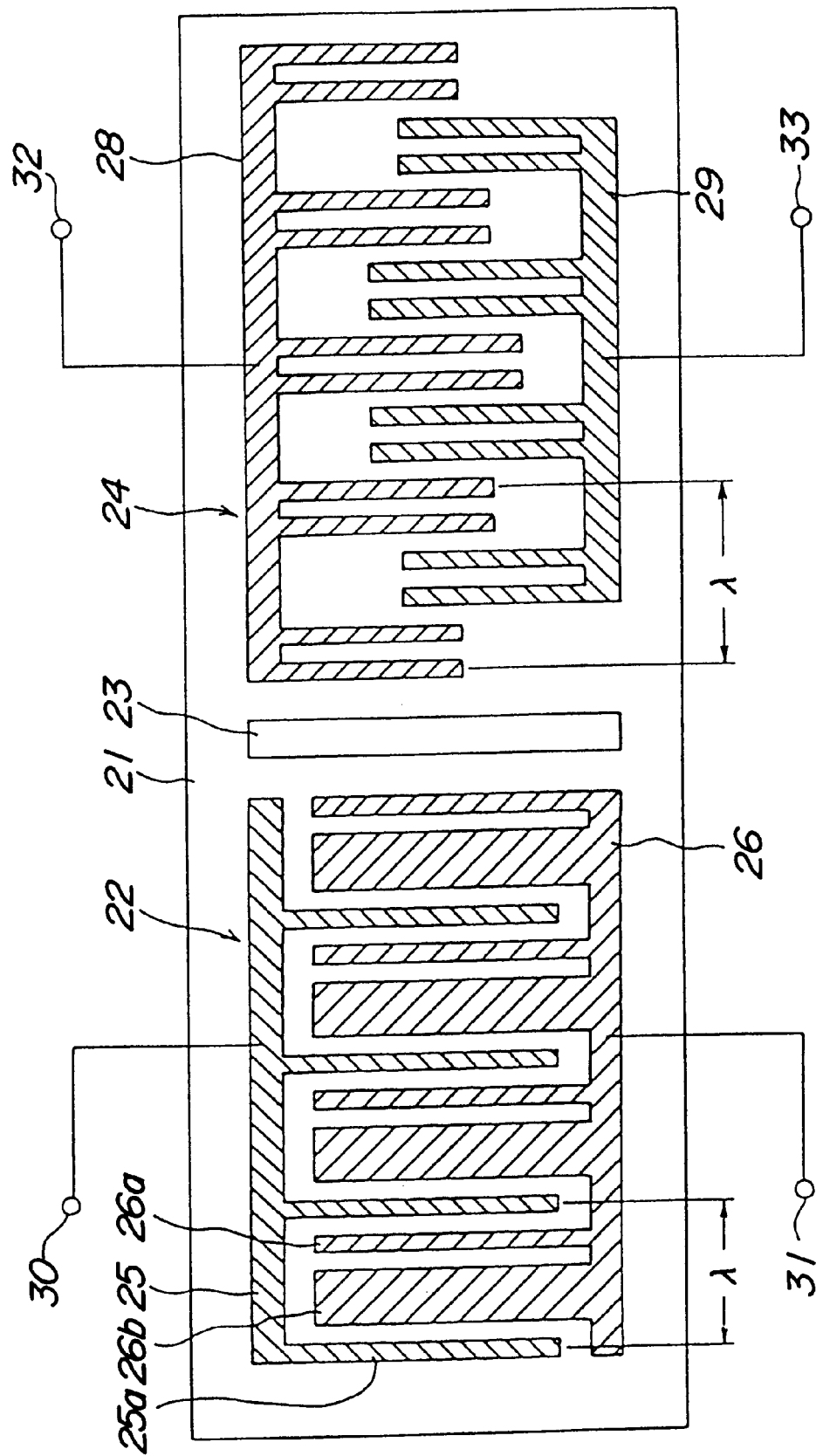
FIG. 2 is a schematic plan view showing a surface acoustic wave filter device according to a second embodiment of the present invention.

FIG. 2 is a schematic plan view of the surface acoustic wave filter device according to a second embodiment of the present invention. The surface acoustic wave filter device of this embodiment includes a piezoelectric substrate 21, as well as an input side transducer 22, a shield electrode 23 and an output side transducer 24 which are formed on the substrate as in the previous embodiment.

The input side transducer 22 of this embodiment is a unidirectional transducer including a positive electrode 25 and a negative electrode 26. The positive electrode 25 is comprised of a plurality of electrode fingers 25a each having a width $\lambda/8$, which are periodically arranged at a pitch $\lambda$, i.e., the wavelength of the fundamental surface acoustic wave generated by the positive electrode 25. The negative electrode 26 is comprised of a plurality of sets of first and second electrode fingers 26a, 26b, which sets are periodically arranged at a pitch $\lambda$. The first electrode finger 26a has a width $\lambda/8$ and the second electrode finger 26b has a width $3\lambda/8$. Furthermore, the first and second electrode fingers 26a, 26b of a set are spaced from each other by a center distance of $3\lambda/4$. The output side transducer 24 is a bidirectional transducer including a positive electrode 28 and a negative electrode 29, and has a structure which is essentially the same as the output side transducer in the embodiment of FIG. 1.

According to the embodiment of FIG. 2, when an input signal is supplied to input terminals 30, 31 connected respectively to the positive electrode 25 and the negative electrode 26 of the input side transducer 22 and the surface acoustic waves are excited by the input side transducer 22, the surface acoustic waves are reflected at the edges of the electrode fingers due to mis-matching of the acoustic impedance. However, due to a unique electrode finger arrangement of the unidirectional input side transducer 22 wherein the negative electrode 26 includes sets of first electrode finger 26a with a width $\lambda/8$ and second electrode finger 26b with a width $3\lambda/8$, it is possible to substantially completely cancel the reflection of the surface acoustic waves toward an opposite direction, i.e., away from the output side transducer 24. More specifically, the surface acoustic wave reflected at the edge of an electrode finger toward the opposite direction has a phase difference of $\lambda/2$ relative to the surface acoustic wave excited at the edge of an adjacent electrode finger and propagating in the normal propagation direction, so that the undesirable reflected waves are substantially completely cancelled. Therefore, in consideration of the surface acoustic wave filter device as a whole, the input side transducer 22 functions as if it excites surface acoustic waves only which propagate exclusively in the desired direction. It should be noted that the resultant reflected waves can be substantially completely cancelled or eliminated without the sacrifice of the insertion loss of the filter device. In other respects, the operation and function of the embodiment of FIG. 2 are essentially same as those of the embodiment of Fig, 1.

Incidentally, reference numerals 32 and 33 in FIG. 2 denote output terminals of the filter device, which are connected respectively to the positive electrode 28 and the negative electrode 29 of the output side transducer 24.

Figure 3:
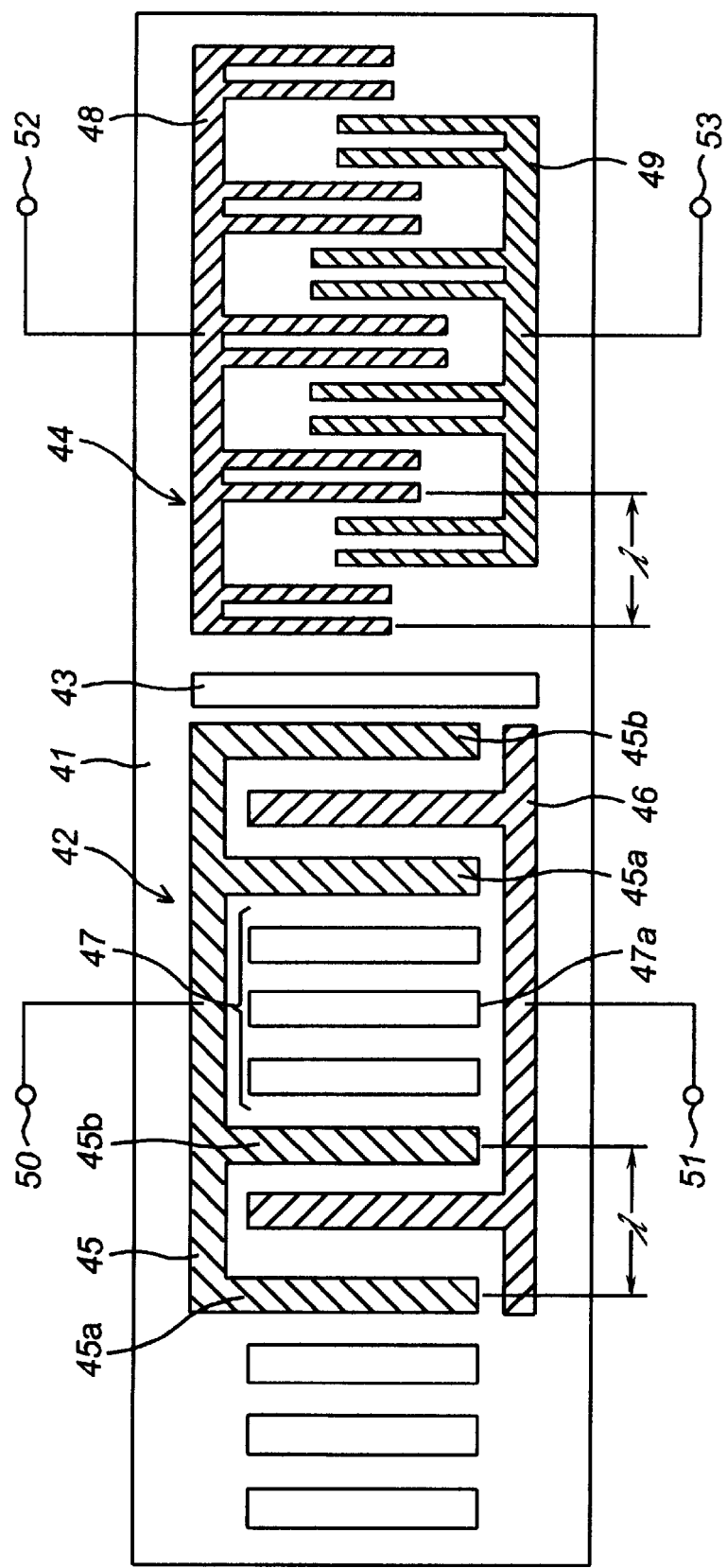
FIG. 3 is a schematic plan view showing a surface acoustic wave filter device according to a third embodiment of the present invention.

FIG. 3 is a schematic plan view of the surface acoustic wave filter device according to a third embodiment of the present invention. The surface acoustic wave filter device of this embodiment includes a piezoelectric substrate 41, as well as an input side transducer 42, a shield electrode 43 and an output side transducer 44 which are formed on the substrate 41 as in the previous embodiment.

The input side transducer 42 of this embodiment is a unidirectional transducer including a positive electrode 45 and a negative electrode 46, The positive electrode 45 is comprised of a plurality of sets of first and second electrode fingers 45a, 45b, which sets are periodically arranged at a pitch $3\lambda$, where $\lambda$ is the wavelength of the fundamental surface acoustic wave. The first and second electrode fingers 45a, 45b each has a width $\lambda/4$ as measured in the propagation direction of the surface acoustic wave. The first and second electrode fingers 45a, 45b of a set are spaced from each other by a center distance $\lambda$.

The negative electrode 46 is comprised of a plurality of electrode fingers which are periodically arranged at a pitch $3\lambda$. Each electrode finger of the negative electrode 46 is arranged at the intermediate position of the adjacent first and second electrode fingers 45a, 45b of the positive electrode 45.

Furthermore, a reflector array 47 is arranged between the adjacent sets of the first and second electrode fingers 45a, 45b of the positive electrode 45. The array 47 is comprised of a set of three floating electrodes 47a, each having a width $\lambda/4$ and being spaced from the other by a center distance $\lambda/4$.

The pitch of the sets of electrode fingers 45a, 45b of the positive electrode 45 may be changed depending upon the number of the floating electrodes 47a.

The output side transducer 44 is a bidirectional transducer including a positive electrode 48 and a negative electrode 49, and has a structure which is essentially the same as the output side transducer in the embodiment of FIG. 1.

In the embodiment of FIG. 3, when an input signal is supplied to the input terminals 50, 51 connected respectively to the positive electrode 45 and negative electrode 46 of the input side transducer and the surface acoustic waves are excited by the input side transducer 42, the surface acoustic waves propagating in the opposite direction away from the output side transducer 44 are reflected by the reflector array 47, and it is thus possible to realize a surface acoustic wave filter device having a minimized insertion loss. Reference numerals 52 and 53 in FIG. 3 denote output terminals of the filter device, which are connected respectively to the positive electrode 48 and the negative electrode 49 of the output side transducer 44.

The operation and function of the embodiment of FIG. 3 are essentially the same as those of the previous embodiments shown in FIG. 2 or FIG. 2.

In the embodiment shown in FIG. 3, the input side transducer 42 may be replaced by a unidirectional transducer, not shown, which includes a first electrode comprised of a plurality of sets of first, second, third and fourth electrode fingers, a second electrode comprised of a plurality of sets of fifth and sixth electrode fingers, and at least one floating electrode arranged between adjacent sets of electrode fingers of the first electrode. In such a unidirectional transducer, the sets of electrode fingers of the first electrode are periodically arranged at a predetermined pitch. Similarly, the sets of electrode fingers of the second electrode are periodically arranged at a predetermined pitch. Each electrode finger of the first electrode and the second electrode has a width $\lambda/8$. In each set of electrode fingers of the first electrode, the first and second electrode fingers are spaced from each other by a center distance $\lambda/4$, the second and third electrode fingers are spaced from each other by a center distance $3\lambda/4$, and the third and fourth electrode fingers are spaced from each other by a center distance $\lambda/4$. Further, in each set of electrode fingers of the second electrode, the fifth and sixth electrode fingers are spaced from each other by a center distance $\lambda/4$. Each set of fifth and sixth electrode fingers in the second electrode is arranged between the second and third electrode fingers of a set in the first electrode.

Figure 4:
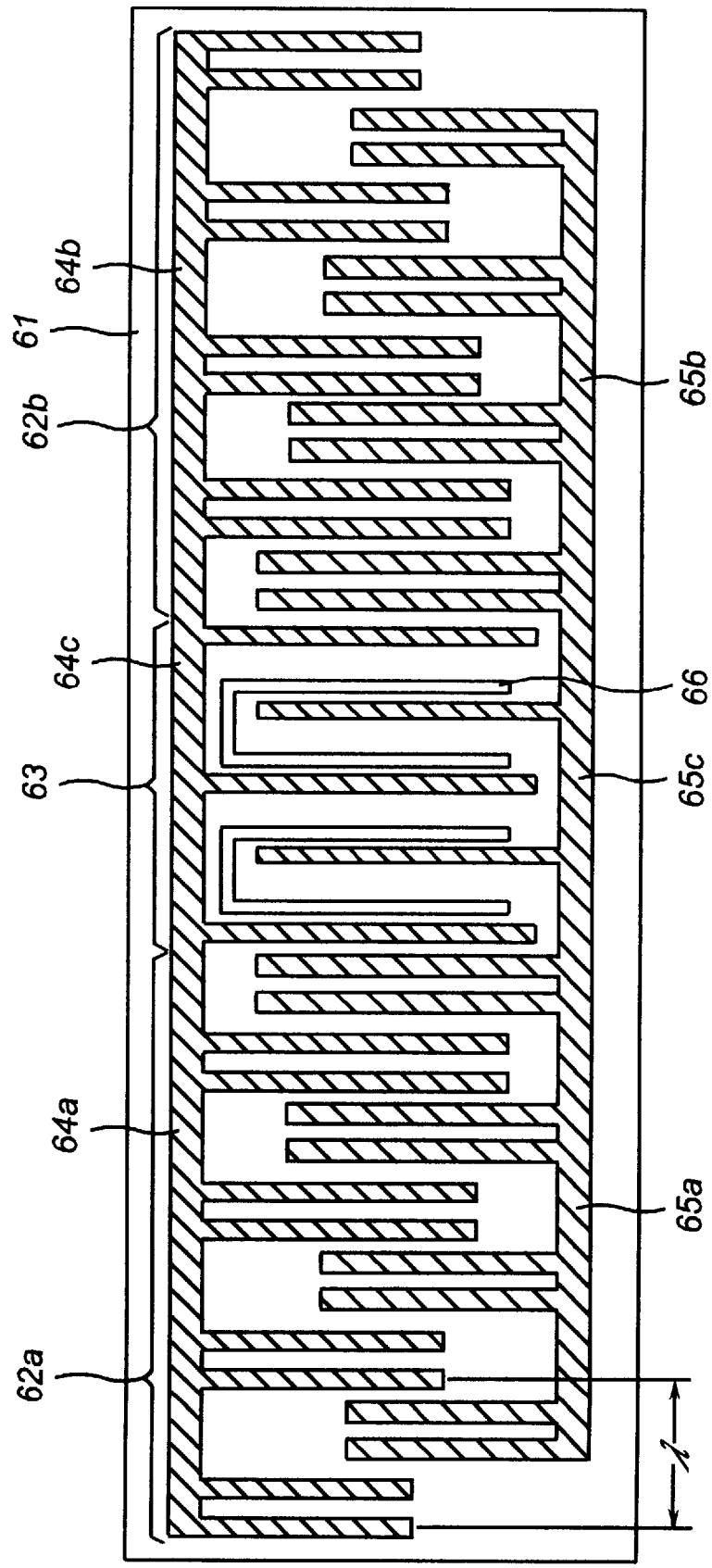
FIG. 4 is a schematic plan view showing one embodiment of transducer for surface acoustic wave filter device according to the present invention.

FIG. 4 is a schematic plan view of one embodiment of a transducer for a surface acoustic wave filter device, according to the present invention. The transducer of this embodiment includes a piezoelectric substrate 61 comprising quartz, as well as a pair of interdigital-type first and second bidirectional electrode portions 62a, 62b and a unidirectional electrode portion 63 which are formed on the substrate 61, wherein the bidirectional electrode portions 62a, 62b are arranged on both sides of the unidirectional electrode portion 63.

The first bidirectional electrode portion 62a includes a positive electrode 64a which is comprised of a plurality of sets of electrode fingers, and a negative electrode 65a which is also comprised of a plurality of sets of electrode fingers. The sets of electrode fingers of the positive electrode 64a are periodically arranged at a pitch $\lambda$, where $\lambda$ is the wavelength of the fundamental surface acoustic wave, with the electrode fingers of each set being spaced from each other by a center distance $\lambda/4$. Similarly, the sets of electrode fingers of the negative electrode 65a are periodically arranged at a pitch $\lambda$, with the electrode fingers of each set being spaced from each other by a center distance $\lambda/4$. Each set of electrode fingers of the negative electrode 65a is spaced from an adjacent set of electrode fingers of the positive electrode 64a by a center distance $\lambda/2$. The electrode fingers of the positive electrode 64a and those of the negative electrode 65a each has a width $\lambda/8$ as measured in the propagation direction of the surface acoustic wave. The electrode fingers of the positive and negative electrodes 64a, 65a in the first bidirectional electrode portion 62a are weighted in accordance with the apodizing method, so that the overlapping length of adjacent electrode fingers of the positive and negative electrodes 64a, 65a varies in the propagation direction of the surface acoustic wave.

The second bidirectional electrode portion 62b is essentially the same as the first bidirectional electrode portion 62a explained above. Thus, the second bidirectional electrode portion 62b includes a positive electrode 64b which is comprised of a plurality of sets of electrode fingers, and a negative electrode 65b which is also comprised of a plurality of sets of electrode fingers. The sets of electrode fingers of the positive electrode 64b are periodically arranged at a pitch $\lambda$, with the electrode fingers of each set being spaced from each other by a center distance $\lambda/4$. Similarly, the sets of electrode fingers of the negative electrode 65b are periodically arranged at a pitch $\lambda$, with the electrode fingers of each set being spaced from each other by a center distance $\lambda/4$. Each set of electrode fingers of the negative electrode 65b is spaced from an adjacent set of electrode fingers of the positive electrode 64b by a center distance $\lambda/2$. The electrode fingers of the positive electrode 64b and those of the negative electrode 65b each has a width $\lambda/8$ as measured in the propagation direction of the surface acoustic wave. The electrode fingers of the positive and negative electrodes 64b, 65b in the second bidirectional electrode portion 62b are weighted in accordance with the apodizing method, 80 that the overlapping length of adjacent electrode fingers of the positive and negative electrodes 64b, 65b varies in the propagation direction of the surface acoustic wave.

The unidirectional electrode portion 63 includes a positive electrode 64c comprised of a plurality of electrode fingers, a negative electrode 65c also comprised of a plurality of electrode fingers, and floating electrodes 66 each being arranged between adjacent electrode fingers of the positive and negative electrodes 64c, 65c. The unidirectional electrode portion 63 is arranged between the first and second bidirectional electrode portions 62a, 62b such that it is situated adjacent to those electrode fingers of the two electrode portions 62a, 62b having the maximum overlapping length.

As shown in FIG. 4, the lengths of the electrode fingers of the unidirectional electrode transducer portion 63 may be greater than the maximum length of the electrode fingers of the bidirectional transducer portion 62a, 62b.

Figure 5:
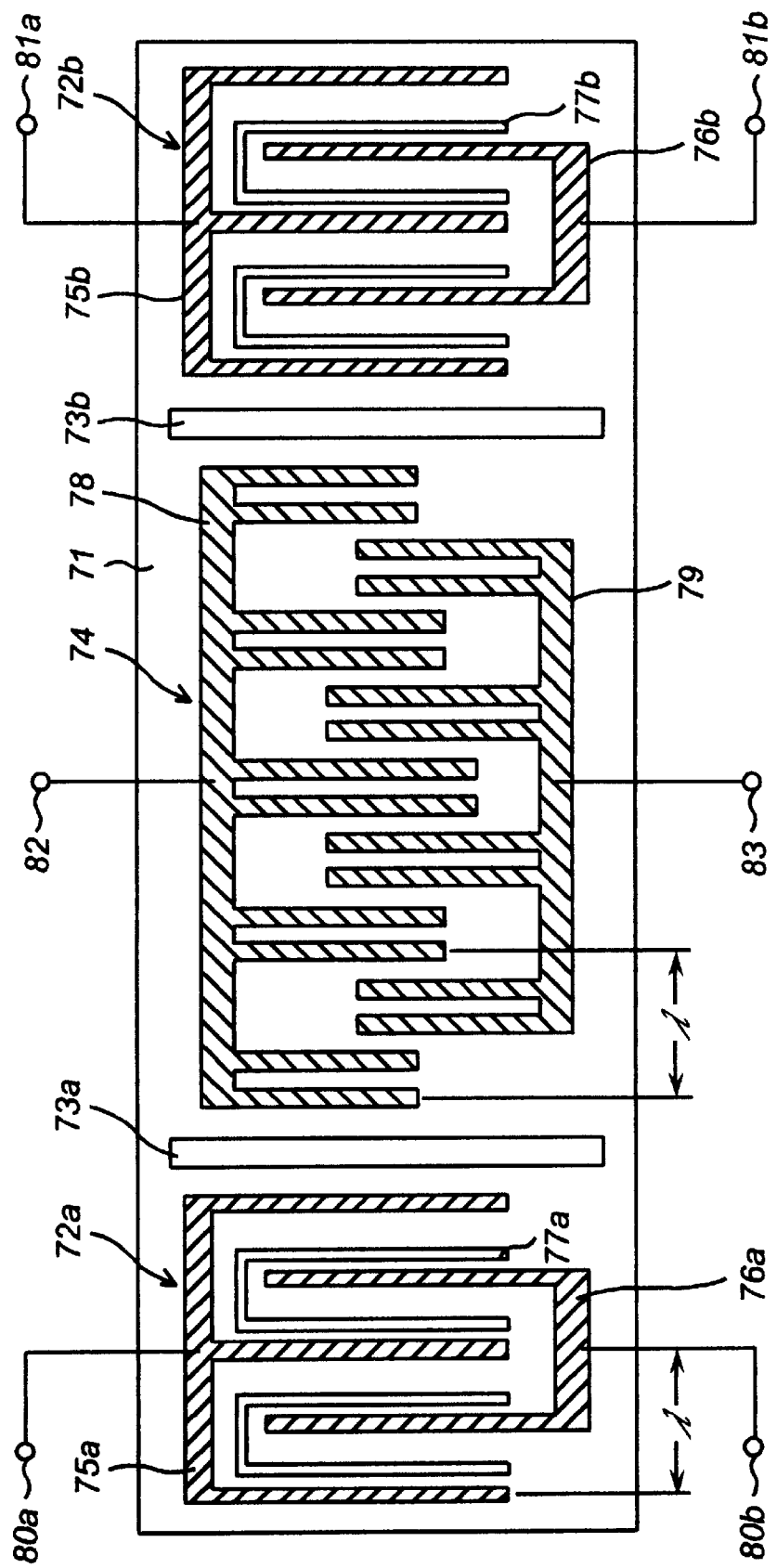
FIG. 5 is a schematic plan view showing a surface acoustic wave filter device according to a fourth embodiment of the present invention.

FIG. 5 is a schematic plan view of a fourth embodiment of the surface acoustic wave filter device according to the present invention. The filter device of this embodiment includes a piezoelectric substrate 71 comprising quartz, as well as a unidirectional input side transducer 74, a pair of bidirectional output side transducers 72a, 72b on both sides of the input side transducer 74, and shield electrodes 73a, 73b between the input side transducer 74 and output side transducers 72a, 72b, which are formed on the substrate 71. The input side transducer 74 and output side transducers 72a, 72b are arranged so that the respective propagation axes of the surface acoustic wave coincide with each other.

The input side transducer 74 includes a positive electrode 78 and a negative electrode 79, and is essentially the same as the output side transducer in the embodiment of FIG. 1. The input side transducer 74 in this embodiment has 330 pairs of positive and negative electrode fingers. The output side transducer 72a includes a positive electrode 75a, a negative electrode 76a and floating electrodes 77a. Similarly, the output side transducer 72b includes a positive electrode 75b, a negative electrode 76b and floating electrodes 77b. Each output side transducer 72a, 72b in this embodiment is essentially the same as the input side transducer in the embodiment of FIG. 1, and has 40 pairs of positive and negative electrode fingers.

In FIG. 5, reference numerals 82, 83 denote the input terminals of the surface acoustic wave filter device, and reference numerals 80a, 80b, 80a, 81b denote the output terminals of the surface acoustic wave filter device.

According to the embodiment of FIG. 5, a pair of unidirectional output side transducers 72a, 72b are arranged on both sides of the bidirectional input side transducer 74, and the output electric signals from the terminals 80a, 80b, 81a, 81b connected to these output side transducers 72a, 72b are added or composited with each other to further improve the insertion loss characteristic of the filter device.

Figure 6:
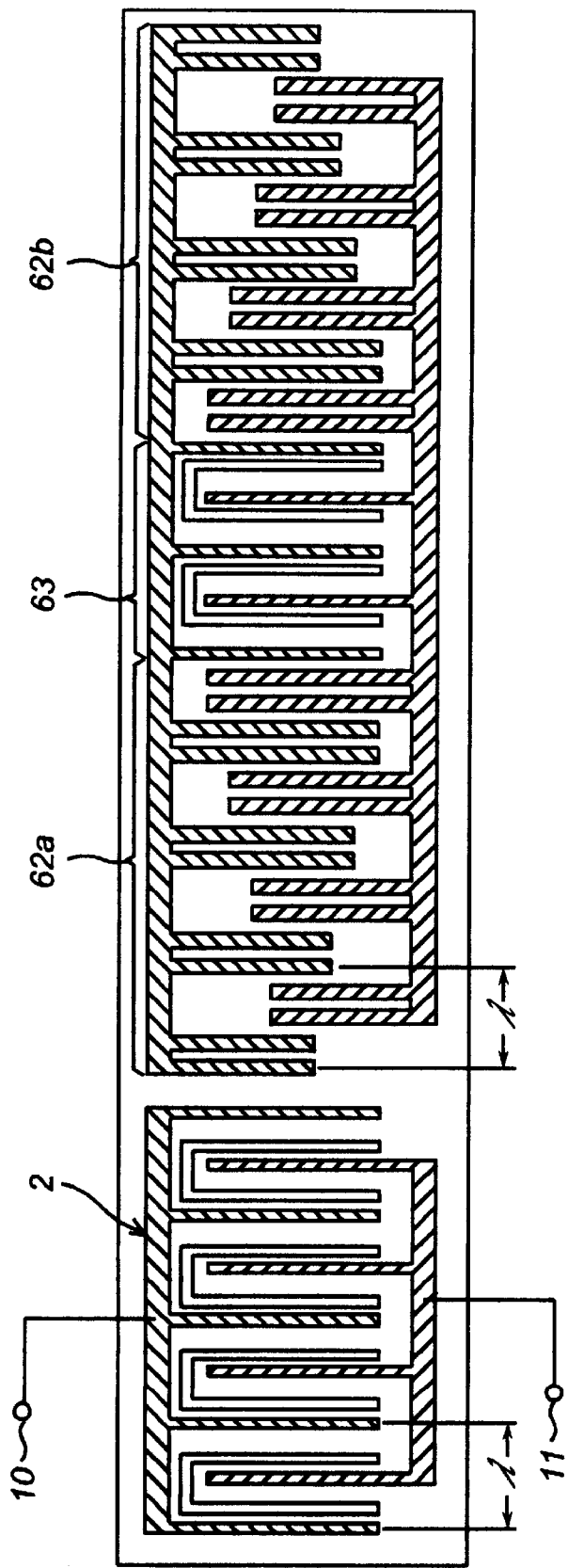
FIG. 6 is a schematic plan view showing a surface acoustic wave filter device according to a fifth embodiment of the present invention.

FIG. 6 is a schematic plan view showing a surface acoustic wave filter device according to a fifth embodiment of the present invention. The filter device of this embodiment includes the bidirectional transducer according to the embodiment of FIG. 4, which is combined with a unidirectional transducer according to the embodiment of FIG. 1. This embodiment is advantageous in that, because the bidirectional transducer has a unidirectional transducer portion, it is possible to further lower the insertion lose of the filter device by several dBs.

Figure 7:
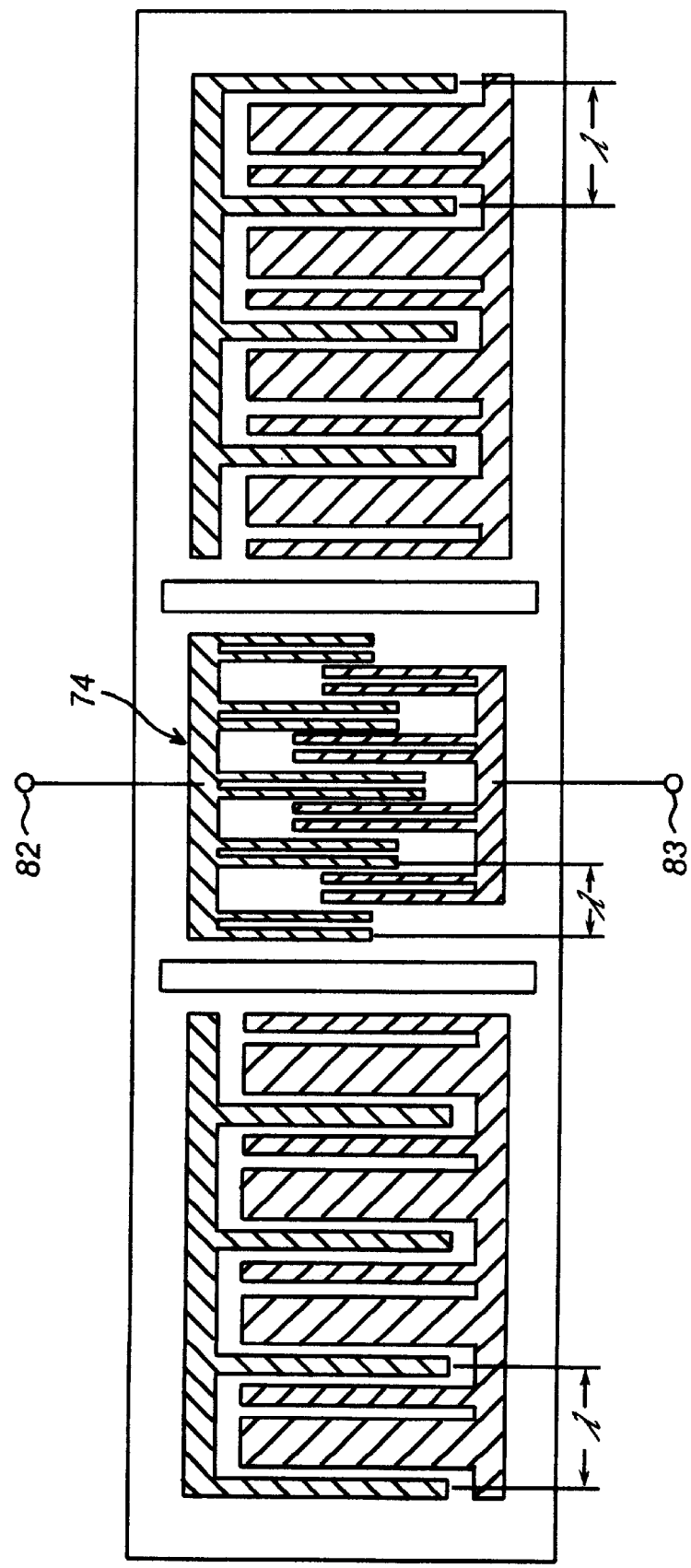
FIG. 7 is a schematic plan view showing a surface acoustic wave filter device according to a sixth embodiment of the present invention.

FIG. 7 is a schematic plan view showing a surface acoustic wave filter device according to a sixth embodiment of the present invention. The filter device of this embodiment has a structure which is basically the same as the embodiment of FIG. 5, except that the unidirectional transducers are replaced by those of the embodiment of FIG. 2.

Figure 8:
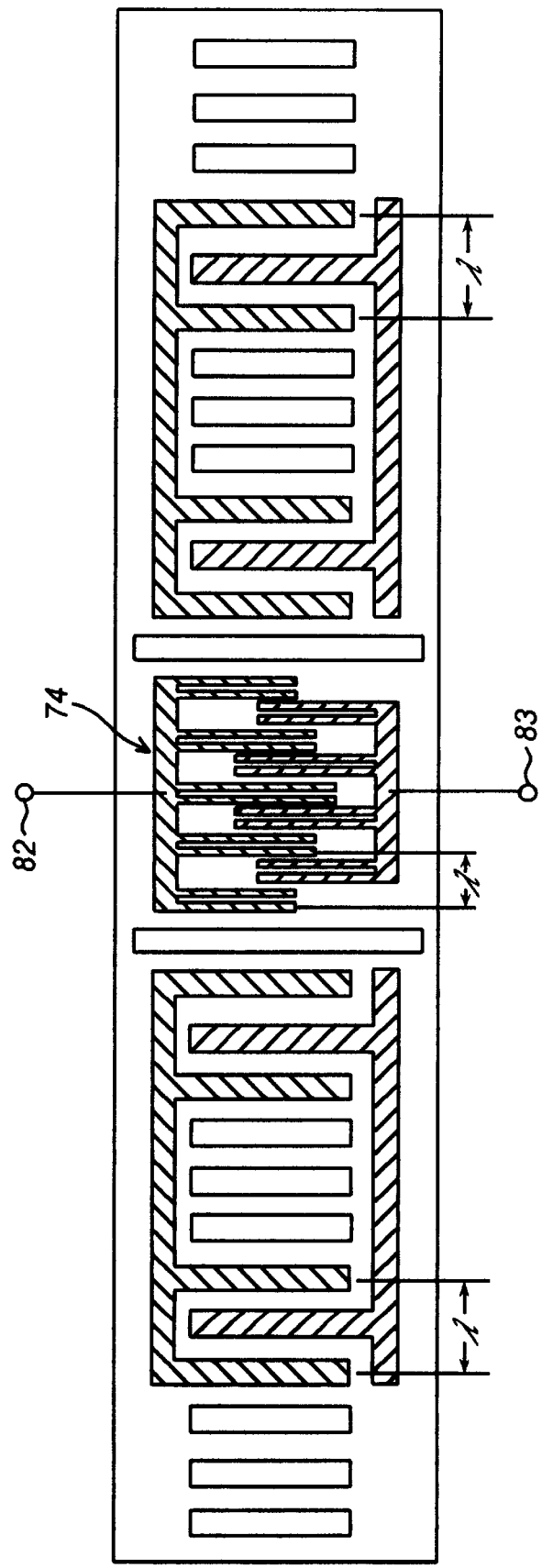
FIG. 8 is a schematic plan view showing a surface acoustic wave filter device according to a seventh embodiment of the present invention.

FIG. 8 is a schematic plan view showing a surface acoustic wave filter device according to a seventh embodiment of the present invention. The filter device of this embodiment has a structure which is basically the same as the embodiment of FIG. 5, except that the unidirectional transducers are replaced by those of the embodiment of FIG. 3.

Figure 13:
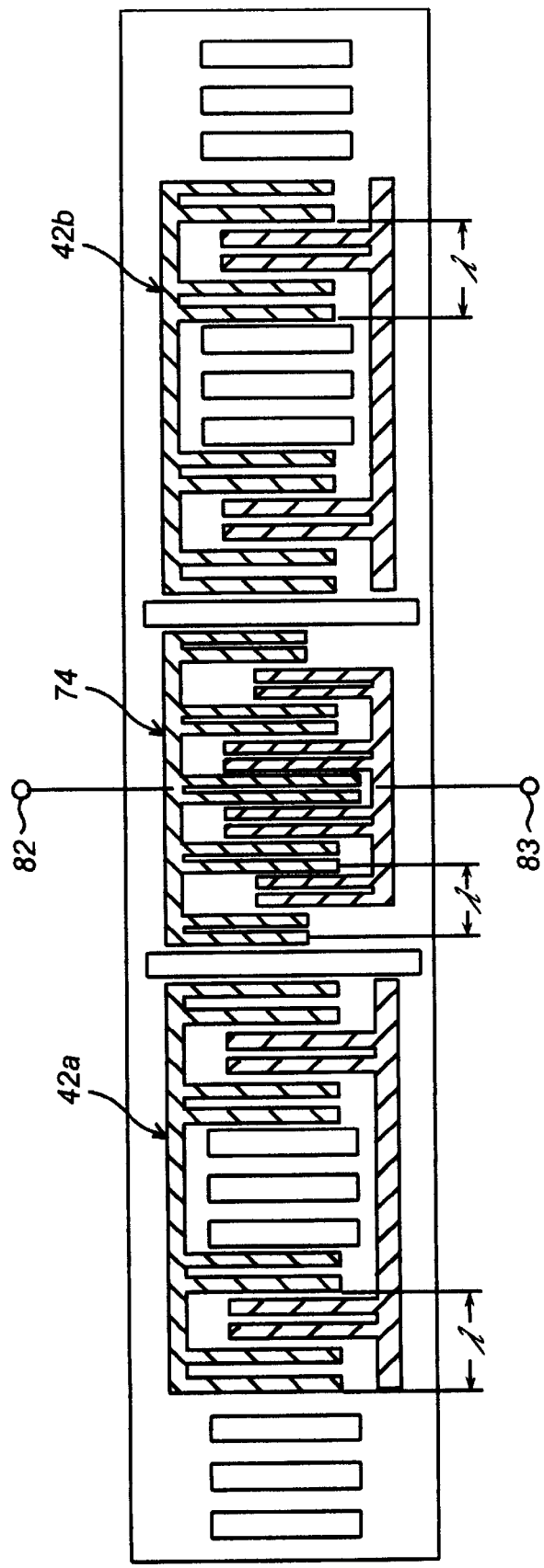
FIG. 13 is a schematic plan view of a surface acoustic wave filter device according to another embodiment of the present invention.

FIG. 13 is a schematic plan view showing a surface acoustic wave device according to another embodiment. The filter device of this embodiment has a structure which is similar to the embodiment shown in FIG. 8.

Figure 14:
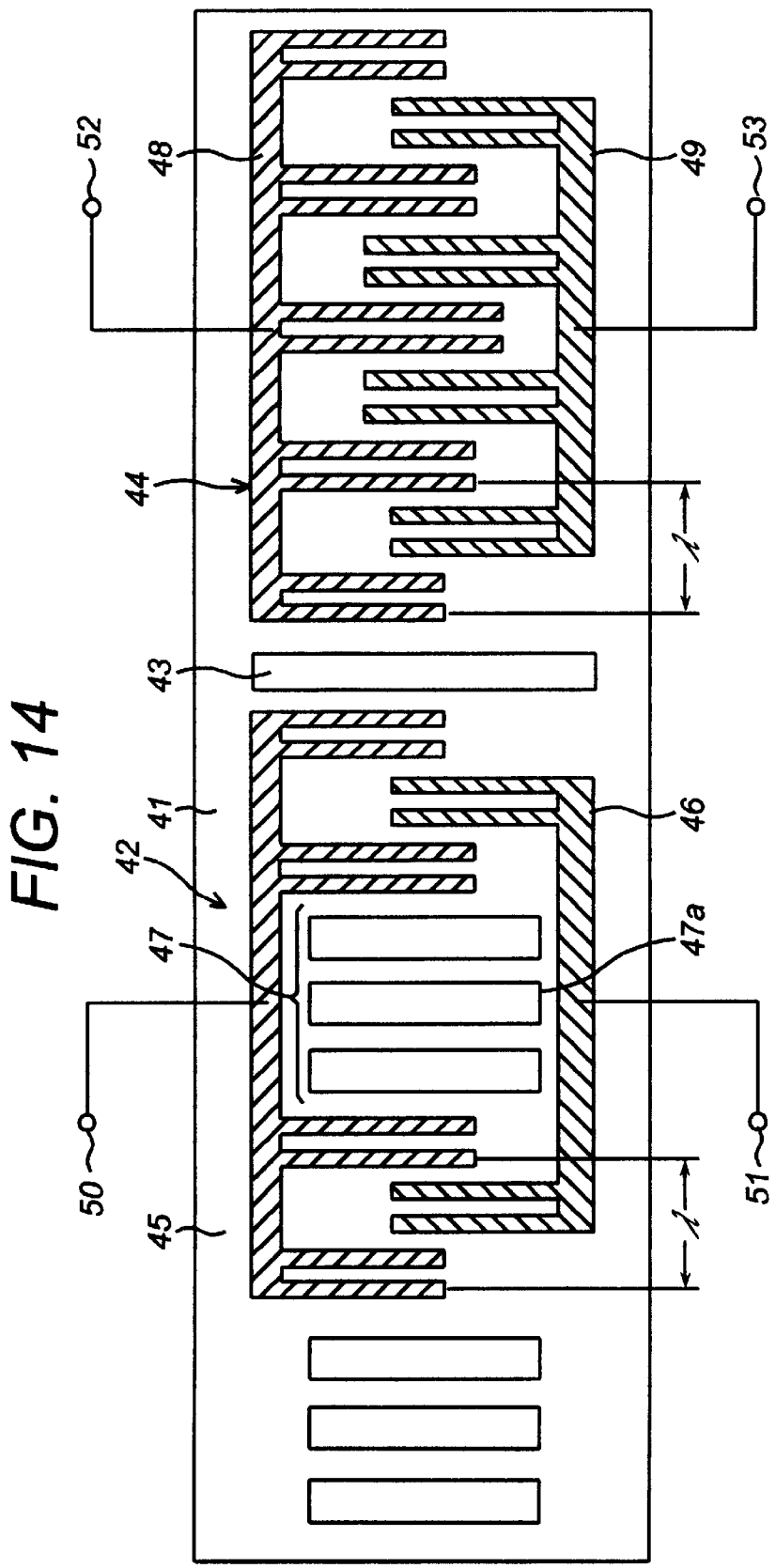
FIG. 14 is a schematic plan view showing another embodiment of a surface acoustic wave filter device of the present invention.

FIG. 14 is a schematic plain view showing a surface acoustic wave device according to another embodiment. The filter device of this embodiment has a structure which is similar to the embodiment shown in FIG. 3.

Figure 9:
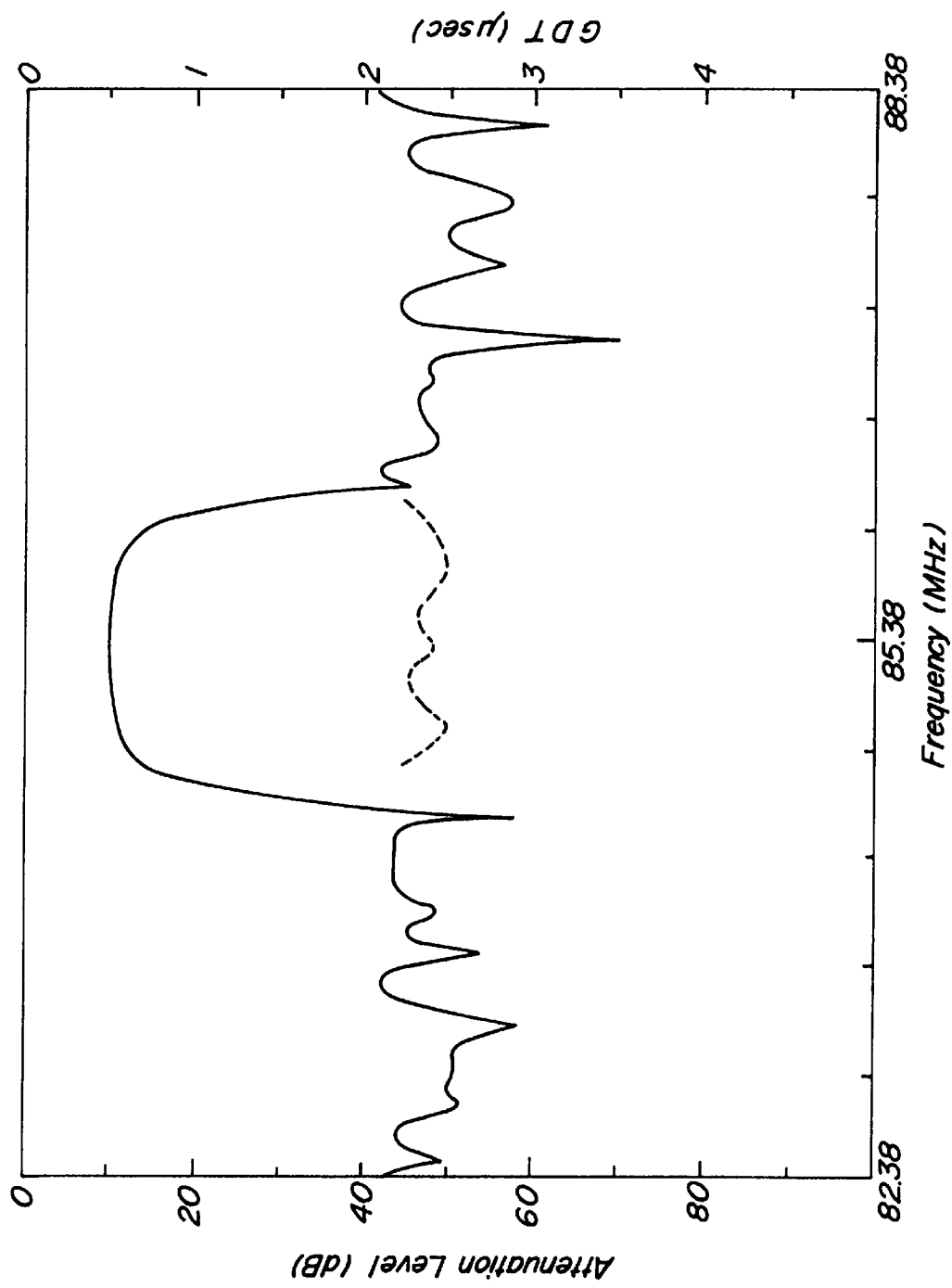
FIG. 9 is a graph showing the filtering characteristic of the filter device according to the embodiment of FIG. 1.

In the following, explanation will be made of the results of experiments performed with respect to the filtering characteristics of the surface acoustic wave filter device according to the present invention. These experiments were conducted by preparing samples of the filter device according to the first, fourth and fifth embodiments shown in FIGS. 1, 5 and 6, respectively. For each sample filter device, frequency characteristics, insertion loss, group delay time (GDT) and T.T.E. attenuation level were measured. The specification of the sample filter devices prepared is as follows:
  1. substrates quartz
  2. number of electrode pairs:
    2.1) 300 pairs for bidirectional transducer
    2.2) 40 pairs for unidirectional transducer
  3. center frequency: 85.38 MHz
  4. weighting: according to the apodizing method for bidirectional transducer FIG. 9 is a graph showing the filtering characteristic of the filter device according to the embodiment shown in FIG. 1. In FIG. 9, the abscissa shows the frequency (MHz) and the ordinate shows the attenuation level (dB) and the group delay time (GDT; $\mu$sec). The solid line corresponds to the attenuation level and the broken line corresponds to the group delay time. It can be recognized from FIG. 9 that the frequency characteristic is substantially free from ripples or distortion within a wide pass band range on both sides of the center frequency, and further that the insertion loss is about 10 dB, GDT ripple is about 0.2 $\mu$sec, and T.T.E. attenuation level is about 40 dB.

Figure 10:
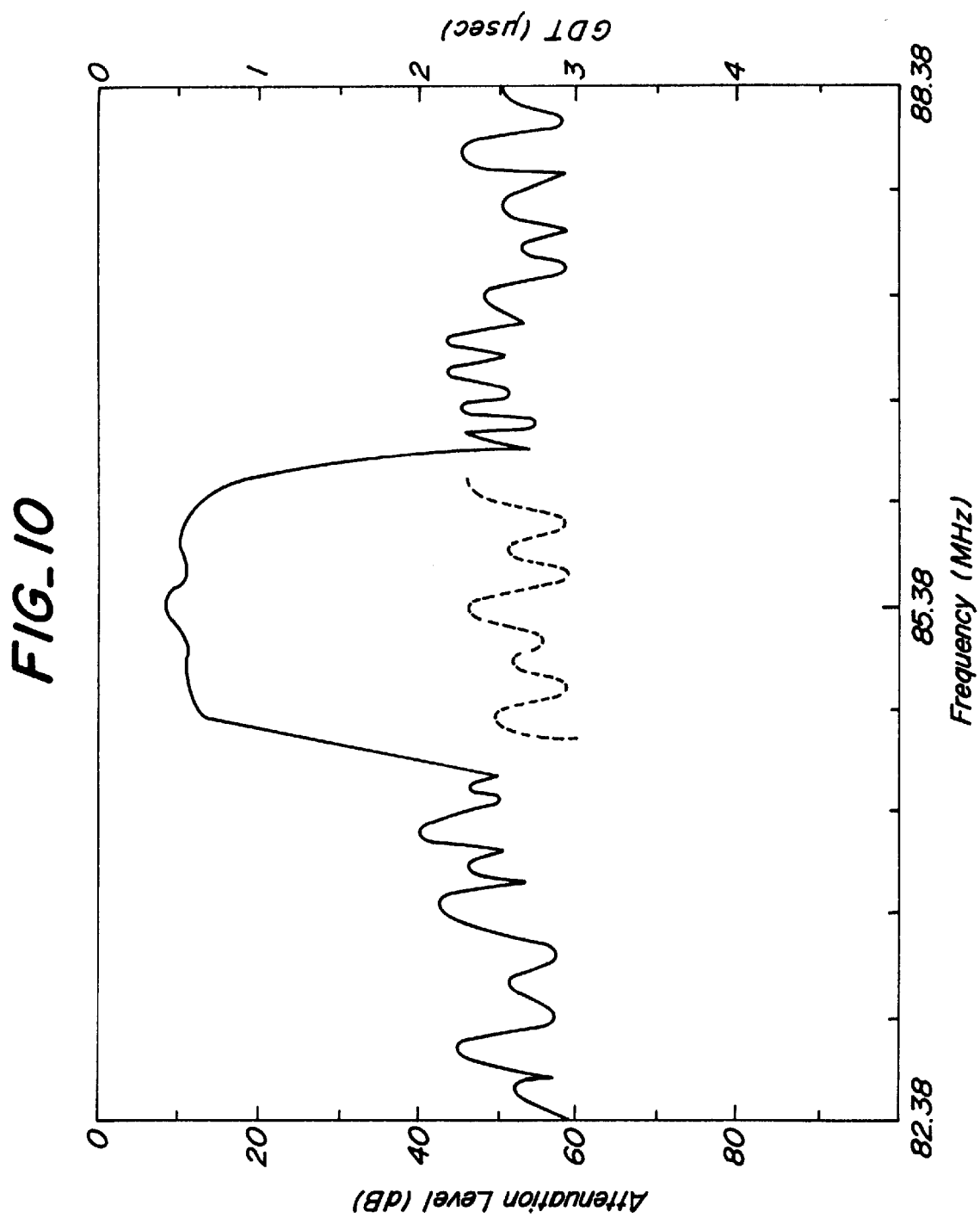
FIG. 10 is a graph showing the filtering characteristic of a comparative filter device in which the bidirectional transducer in the embodiment of FIG. 1 has been replaced by a unidirectional transducer.

FIG. 10 is a graph showing the filtering characteristic of a comparative filter device in which the bidirectional transducer in the embodiment of FIG. 1 has been replaced by a unidirectional transducer. This means that the input side and output side transducers of the comparative filter device are both formed of unidirectional transducers. The insertion loss is lowered to about 8 dB, though ripples of the magnitude of 1 dB or more can be recognized in the frequency characteristic near the center frequency. It is clear that such ripples resulted from application of weighting to the unidirectional transducers in the comparative filter device. Therefore, it proved to be highly advantageous to apply weighting to the bidirectional transducer having a symmetrical electrode arrangement, and to combine such bidirectional transducer with a unidirectional transducer of a normal type which is not applied with weighting.

Figure 11:
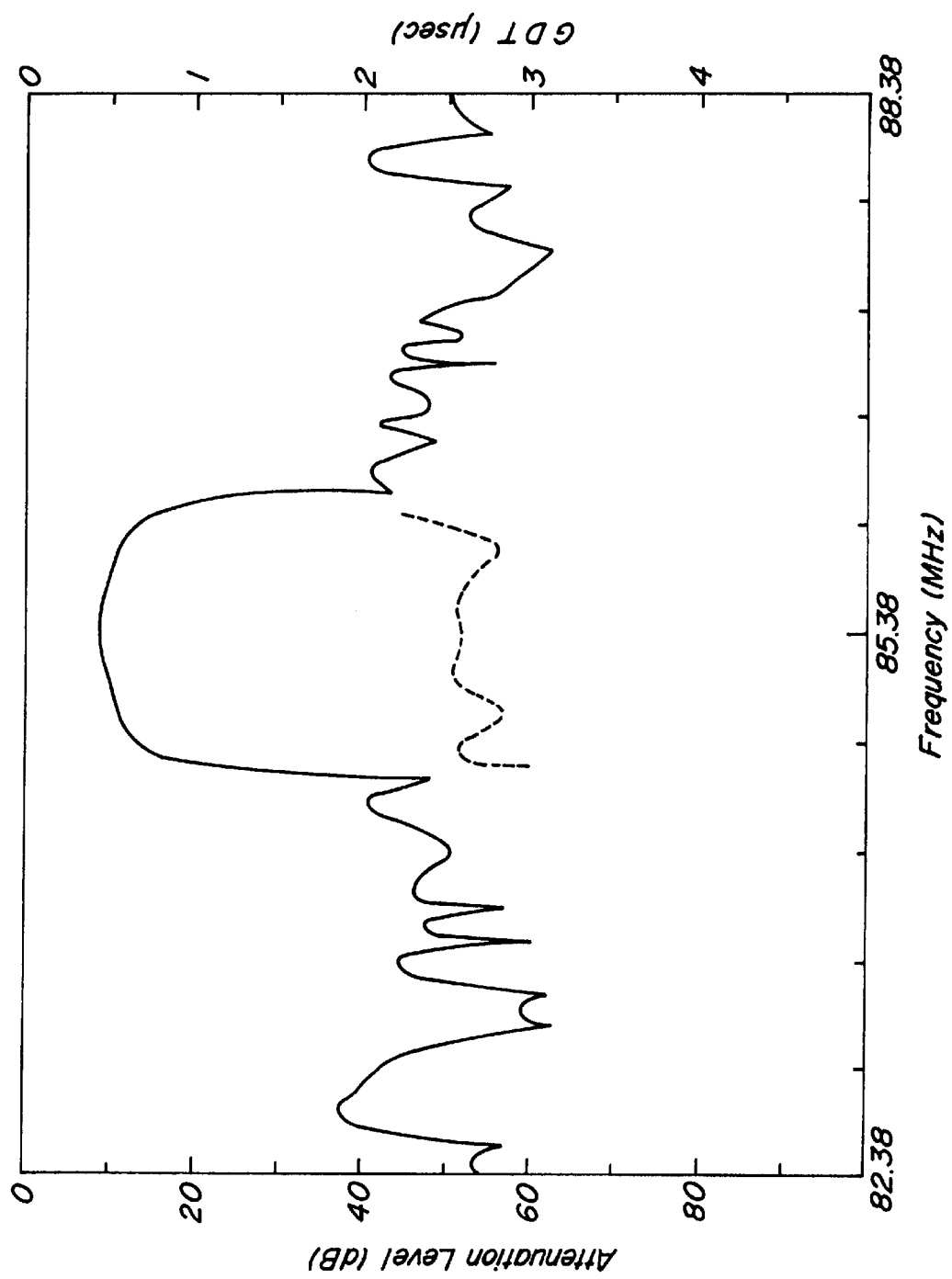
FIG. 11 is a graph showing the filtering characteristic of the filter device according to the embodiment of FIG. 5.

FIG. 11 is a graph showing the filtering characteristic of the filter device according to the embodiment of FIG. 5. In this case, the filter device has a frequency characteristic which is substantially free from ripples or distortion within a wide pass band range on both sides of the center frequency, an insertion loss of about 8.5 dB, GDT ripple of about 0.3 $\mu$sec, and T.T.E. attenuation level of about 50 dB.

Figure 12:
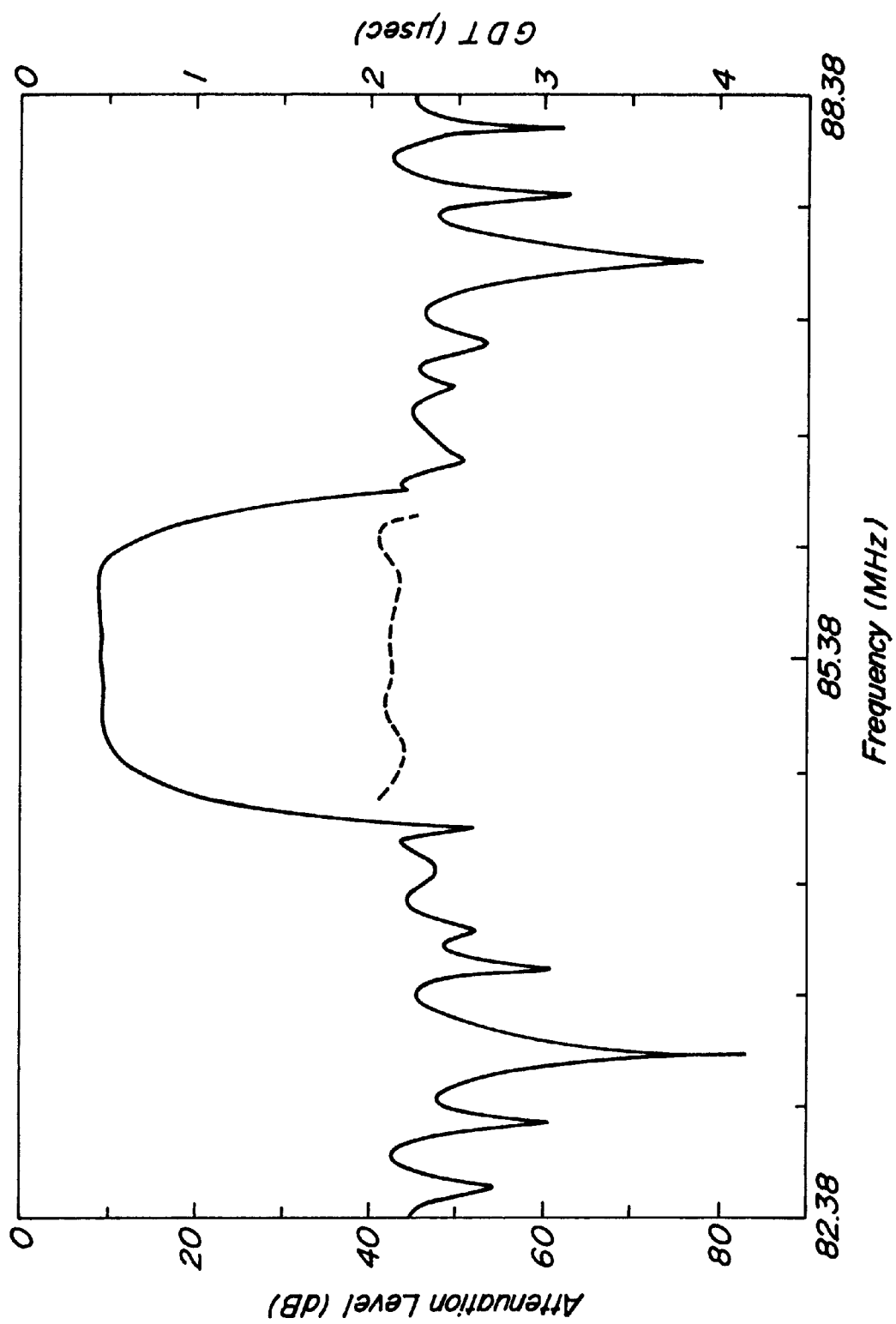
FIG. 12 is a graph showing the filtering characteristic of the filter device according to the embodiment of FIG. 6.

FIG. 12 is a graph showing the filtering characteristic of the filter device according to the embodiment of FIG. 6. In this case, the filter device has a frequency characteristic which is substantially free from ripples or distortion within a wide pass band range on both sides of the center frequency, an insertion loss of about 8 dB which is lower by 2 dB than the insertion loss shown in FIG. 9, GDT ripple of about 0.3 $\mu$sec, and T.T.E. attenuation level of about 50 dB.

It can be clearly appreciated from FIGS. 9 to 12 that the surface acoustic wave filter device according to the present invention provides satisfactory filtering characteristics in terms of frequency characteristic, insertion loss, GDT and T.T.E. attenuation level, and it is thus particularly suitable as a filter device for CDMA communication system.

While the present invention has been described above with reference to certain preferred embodiments, it should be noted that they were presented by way of examples only and various changes and/or modifications may be made without departing from the scope of the invention. Thus, for example, the substrate of the device may be comprised of $LiNbO_3$, $LiTaO_3$, $LiB_4O_7$ or other suitable piezoelectric material, instead of quartz as in the illustrated embodiments. In particular, a substrate comprising $LiTaO_3$ or $LiB_4O_7$ has electromechanical coupling coefficient and reflection coefficient which are substantially same as those of quartz. Therefore, $LiTaO_3$ substrate and $LiB_4O_7$ substrate each provides particularly excellent filtering characteristics like the quartz substrate.

What is claimed is:

1. A surface acoustic wave filter device comprising:

a piezoelectric substrate;

an input side transducer formed on said substrate, for exciting a surface acoustic wave;

an output side transducer formed on said substrate, for receiving and converting the surface acoustic wave excited by said input side transducer;

one of said transducers comprising a unidirectional transducer and the other of said transducers comprising a bidirectional transducer, wherein said unidirectional transducer comprises at least one electrode comprising a plurality of sets of first and second electrode fingers, said sets of electrode fingers being periodically arranged at a pitch $\lambda$ which is the propagation wavelength of said surface acoustic wave, said first electrode finger having a width $\lambda/8$, said second electrode finger having a width $3\lambda/8$, and said first and second electrode fingers being spaced from each other at a center distance $3\lambda/8$;

wherein said bidirectional transducer comprises electrode fingers of a split-structure, said electrode fingers of the bidirectional transducer each having a width $\lambda/8$; and wherein said unidirectional transducer comprises a normal electrode and said bidirectional transducer comprises a weighted electrode.

2. A surface acoustic wave filter device comprising:

a piezoelectric substrate;

an input side transducer formed on said substrate, for exciting a surface acoustic wave; an output side transducer formed on said substrate, for receiving and converting the surface acoustic wave excited by said input side transducer;

one of said transducers comprising a unidirectional transducer and the other of said transducers comprising a bidirectional transducer, wherein said unidirectional transducer comprises a first electrode which comprises a plurality of sets of first and second electrode fingers, which sets are periodically arranged at a predetermined pitch, said first and second electrode fingers of each set having a width $\lambda/4$ as measured in the propagation direction of the surface acoustic wave, where $\lambda$ is the propagation wavelength of said surface acoustic wave, and one of said set of electrode finders is spaced from the other by a center distance $\lambda$; a second electrode comprising a plurality of electrode fingers each arranged between the first and second electrode fingers of each set of said first electrode, and having a width $\lambda/4$; and at least one floating electrode arranged between opposite first and second electrode fingers of adjacent sets of said first electrode and having a width $\lambda/4$; and wherein said bidirectional transducer comprises electrode fingers of a split-structure, said electrode fingers of the bidirectional transducer each having a width $\lambda/8$.

3. A surface acoustic wave filter device comprising:

A) a piezoelectric substrate;

B) an input side transducer formed on said substrate, for exciting a surface acoustic wave; and C) an output side transducer formed on said substrate, for receiving and converting the surface acoustic wave excited by said input side transducer;

D) one of said transducers comprising a unidirectional transducer and the other of said transducers comprising a bidirectional transducer, wherein said unidirectional transducer comprises:

i) a first electrode comprising a plurality of sets of electrode fingers arranged at a predetermined pitch, each of said sets of the first electrode comprising first, second, third and fourth electrode fingers each having a width $\lambda/8$ as measured in the propagation direction of the surface acoustic wave, where $\lambda$ is the propagation wavelength of said surface acoustic wave, said first and second electrode fingers of each set being spaced from each other by a center distance $\lambda/4$, said second and third electrode fingers of each set being spaced from each other by a center distance $3\lambda/4$, and said third and fourth electrode fingers of each set being spaced from each other by a center distance $\lambda/4$;

ii) a second electrode comprising a plurality of sets of electrode fingers arranged at a predetermined pitch, each of said sets of the second electrode comprising fifth and sixth electrode fingers each having a width $\lambda/8$ as measured in the propagation direction of the surface acoustic wave, said fifth and sixth electrode fingers of each set being spaced from each other by a center distance $\lambda/4$ and arranged between the second and third electrode fingers of an adjacent set of the first electrode; and iii) at least one floating electrode having a width $\lambda/4$ as measured in the propagation direction of the surface acoustic wave and arranged between neighboring sets of electrode fingers of the first electrode.

* * * * *